United States Patent
Karpov et al.

(10) Patent No.: US 10,706,921 B2
(45) Date of Patent: Jul. 7, 2020

(54) INTEGRATED 1T1R RRAM MEMORY CELL

(71) Applicant: INTEL CORPORATION, Santa Clara, CA (US)

(72) Inventors: Elijah V. Karpov, Portland, OR (US); Ravi Pillarisetty, Portland, OR (US); Prashant Majhi, San Jose, CA (US); Niloy Mukherjee, Portland, CA (US); Uday Shah, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/080,922

(22) PCT Filed: Apr. 1, 2016

(86) PCT No.: PCT/US2016/025694
§ 371 (c)(1),
(2) Date: Aug. 29, 2018

(87) PCT Pub. No.: WO2017/171866
PCT Pub. Date: Oct. 5, 2017

(65) Prior Publication Data
US 2019/0066779 A1 Feb. 28, 2019

(51) Int. Cl.
*G11C 13/00* (2006.01)
*H01L 27/24* (2006.01)

(52) U.S. Cl.
CPC ........ *G11C 13/0007* (2013.01); *G11C 13/003* (2013.01); *H01L 27/2445* (2013.01); *G11C 2213/15* (2013.01); *G11C 2213/53* (2013.01); *G11C 2213/73* (2013.01); *G11C 2213/74* (2013.01); *G11C 2213/79* (2013.01); *G11C 2213/82* (2013.01)

(58) Field of Classification Search
USPC .......................................................... 365/148
See application file for complete search history.

(56) References Cited

U.S. PATENT DOCUMENTS

| | | | |
|---|---|---|---|
| 7,989,889 B1 * | 8/2011 | Kerr | ................. H01L 29/1045 257/335 |
| 2009/0168503 A1 | 7/2009 | Fackenthal et al. | |
| 2010/0061145 A1 | 3/2010 | Weis | |
| 2010/0258776 A1 | 10/2010 | Li | |
| 2012/0018845 A1 | 1/2012 | Lung et al. | |
| 2013/0201749 A1 | 8/2013 | Chung | |

OTHER PUBLICATIONS

International Search Report received in PCT Application No. PCT/US2016/025694, dated Apr. 1, 2016, 8 pages.

* cited by examiner

*Primary Examiner* — James G Norman
(74) *Attorney, Agent, or Firm* — Grossman, Tucker, Perreault & Pfleger, PLLC (57) ABSTRACT

One embodiment provides an apparatus. The apparatus includes a bipolar junction transistor (BJT) and an integrated resistive element. The BJT includes a base contact, a base region, a collector contact, a collector region and an integrated emitter contact. The integrated resistive element includes a resistive layer and an integrated electrode. The resistive element is positioned between the base region and the integrated emitter contact.

25 Claims, 3 Drawing Sheets

INTEGRATED 1T1R RRAM MEMORY CELL

FIELD

The present disclosure relates to a memory cell, in particular to, an integrated 1T1R (one transistor, one resistor) RRAM (resistive random access memory) memory cell.

BACKGROUND

1T1R RRAM (one transistor, one resistor resistive random access memory) memory cells contain one transistor as a selector and one resister (i.e., resistive element) configured to store data. The memory cells may be programmed by supplying voltage and/or current to each memory cell. The memory cells may be read by providing a smaller current and/or voltage and detecting the resistive element voltage and/or current. Programming some resistive elements may consume relatively high power (e.g., relatively high current) to ensure reliable results. The transistor and associated resistor may be formed in different interconnected layers of a manufacturing process. Forming and interconnecting the different layers can contribute to process complexity.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

1T1R RRAM memory cells each contain one transistor and one resistor. The resistor, i.e., resistive element, corresponds to a memory element and is configured to store data. The transistor corresponds to a selector configured to select an associated memory element for memory access operations. In RRAM (resistive random access memory) cells, a value of the data stored by a resistive memory element is related to a resistance of the memory element. For example, for a memory element configured store one bit, a low resistance state (LRS) may correspond to a logic 1 and a high resistance state (HRS) may correspond to a logic 0. A reset operation is configured to change a memory element from the LRS to the HRS. A set operation is configured to change a memory element from the HRS to the LRS. The set and reset operations (i.e., write operations) may be initiated by selection of a target memory element via a control input to the associated transistor (i.e., selector) followed by application of an appropriate voltage (and current) to the target memory element for an appropriate time duration. A read operation may be initiated by selection of the target memory element via another control input to the associated transistor followed by application of an appropriate read voltage and/or current. The read current and/or voltage are configured to allow detecting a state of the resistive element without changing the state of the resistive element. The state of the resistive element may be determined through sensing.

Generally, this disclosure relates to an integrated 1T1R RRAM memory cell. Each integrated memory cell includes a bipolar junction transistor (BJT) and an integrated resistive element. The resistive element includes a resistive layer and an integrated electrode. The resistive element is positioned between a base region and an integrated emitter contact of the BJT. In other words, the resistive layer of the resistive element corresponds to a doped emitter region of the BJT and the electrode (e.g., a metal electrode) of the resistive element corresponds to an emitter electrode of the BJT.

Integrating the resistive element and the transistor, consistent with the present disclosure, may facilitate fabricating 1T1R memory cells. In other words, rather than fabricating the transistor and the resistive element as separate devices on separate, interconnected layers of a device, the resistive element and transistor are integrated. A BJT may provide relatively higher current than a corresponding MOSFET (metal oxide semiconductor field effect transistor) thus, facilitating relatively more reliable programming of the memory cell.

Figure 1:
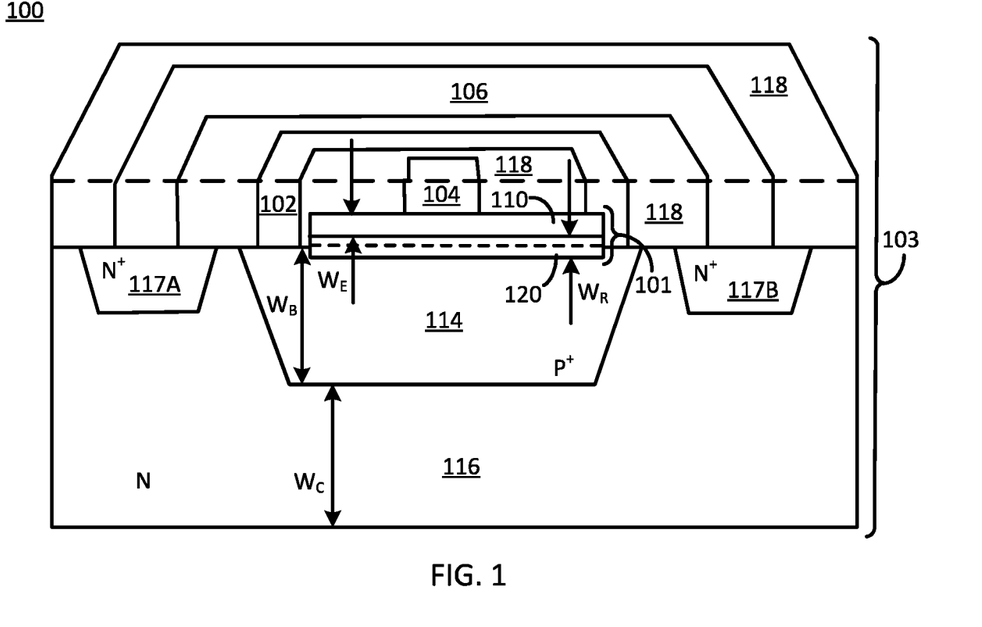
FIG. 1 illustrates a sketch of an integrated 1T1R RRAM (one transistor, one resistor resistive random access memory) memory cell structure consistent with several embodiments of the present disclosure.

FIG. 1 illustrates a sketch of an integrated 1T1R RRAM memory cell structure 100 consistent with several embodiments of the present disclosure. The integrated memory cell structure 100 contains a BJT 103 and a resistive element 101 integrated in the BJT 103. The resistive element 101 corresponds to an emitter portion of the BJT 103.

The memory cell structure 100 includes a base contact 102, an integrated emitter contact 104, a collector contact 106, a base region 114, a collector region 116 and a plurality of insulator regions 118. The insulator regions 118 are positioned between the contacts 102, 104, 106. The insulator regions 118 are formed of an insulating material, e.g., silicon dioxide (SiO2). The resistive element 101 includes an integrated electrode 110 and a resistive layer 120. The contacts 102, 104, 106 are configured to couple the integrated memory cell 100 to a memory controller via one of more of a word line (WL), bit line (BL) and/or selector line (SL), as described herein. A width, $W_B$, of the base region 114 is much less than a diffusion length. In some embodiments, the resistive layer 120 may include a plurality of sub-layers. The integrated electrode 110 and the resistive layer 120 correspond to the resistive element 101 of integrated memory cell 100. The resistive layer 120 further provides emitter layer functionality of the BJT included in memory cell structure 100.

For example, a width $W_E$ of the integrated electrode 110 may be in the range of 2 nanometers (nm) to 10 nm. A width $W_R$ of the resistive layer 120 may be in the range of 2 nm to 10 nm. A width $W_C$ of the collector region 116 may be less than 10 nm. The width, $W_B$, of the base region 114 is in the range of 1 nm to 25 nm and is less than a carrier diffusion length. The width, $W_B$, is related to a dopant concentration in the base region 114. For example, the width, $W_B$, may decrease as the dopant concentration increases.

The integrated electrode 110 may be formed of a conductive or a semi-conductive material. The integrated electrode 110 is configured to facilitate forming a conductive filament in the resistive layer 120 (and/or sub-layers), as described herein. For example, the integrated electrode 110 may contain a metal (e.g., Ta (tantalum), Hf (hafnium), Ti (titanium), TiN (titanium nitride), TaN (tantalum nitride), TiAlN (titanium aluminum nitride), TaAlN (tantalum aluminum nitride) and/or alloys and/or combinations thereof). In another example the integrated electrode 110 may contain Cu (copper), Ag (silver), Si (silicon), i.e., a material that may relatively easily dissolve and diffuse in the resistive layer 120. In another example, the integrated electrode 110 may contain a conductive oxide material, e.g., ITO (indium tin oxide), Ti2O3 (titanium oxide), MoO2 (molybdenum oxide), WO2 (tungsten oxide), and/or combinations thereof.

In an embodiment, the resistive layer 120 (and/or sub-layers) may contain an oxide material. The oxide material may include, but is not limited to, HfOx (hafnium oxide), TaOx (tantalum oxide), WOx (tungsten oxide), TiOx (titanium oxide), doped Silicon Oxide, doped silicon nitride, AlOx (aluminum oxide) and/or alloys and/or combinations thereof. In another embodiment, the resistive layer 120 may contain a chalcogenide material. Chalcogenide materials may include, but are not limited to, group VI elements such as S (sulfur), Se (selenium), Te (tellurium). Binary chalcogenide materials may include, but are not limited to GeTe (germanium tellurium) and SiTe (silicon tellurium). The resistive layer 120 may correspond to an N-type emitter region for the BJT 103. Thus, the BJT 103 included in the integrated memory cell may correspond to an npn device.

The base region 114 and/or the collector region 116 may contain group III-V elements or group IV elements. For example, the base region 114 and/or the collector region 116 may contain Si (silicon) and/or SiGe (silicon and germanium). In another example, the base region 114 and the collector region 116 may each contain GaInAs (gallium indium arsenide). Each region 114, 116 may be appropriately doped, e.g., P-type for the base region 114 and N-type for the collector region 116. The collector region 116 may further include regions 117A, 117B with relatively higher doping, adjacent the collector contact 106.

In operation, the integrated electrode 110 is configured to interact with the resistive layer 120 (and/or sub-layers) in response to a bias voltage applied across base contact 102 and integrated emitter contact 104. For example, during a set operation (i.e., changing the state of the resistive element 101 from a HRS to a LRS), a conductive filament may be created by an electric field related to a voltage applied across the resistive element 101. For example, a first base-emitter voltage, $V_{BE}$, may be applied across base contact 102 and integrated emitter contact 104. As a result of the electric field and current, a conductive path may be created between the integrated electrode 110 and the base region 114. Thus, resistance of the resistive element 101 may be reduced. In another example, during a reset operation (i.e., changing the state of the resistive element 101 from a LRS to a HRS), a conductive filament extending from the integrated electrode 110 through the resistive layer 120 to the base region 114 may disconnect from the base region 114 (i.e., a conductive path may be broken) as a result of an electric field and current related to a second base-emitter voltage applied across the resistive element 101. Thus, resistance of the resistive element 101 may be increased.

Figure 2:
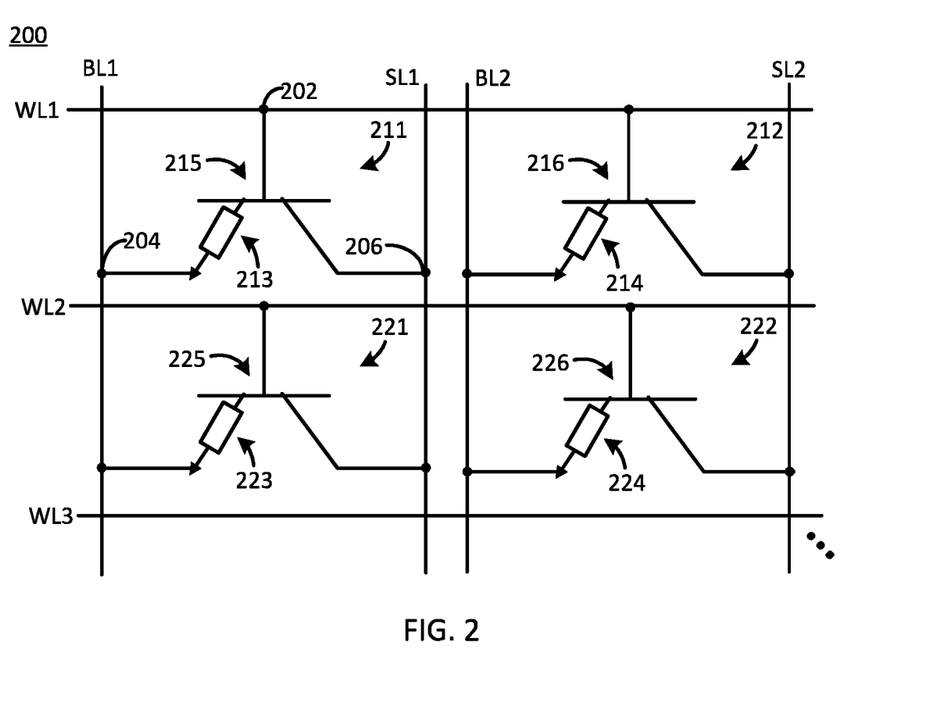
FIG. 2 illustrates a circuit diagram of a portion of a memory array that includes a plurality of integrated 1T1R RRAM memory cells consistent with several embodiments of the present disclosure.

FIG. 2 illustrates a circuit diagram of a portion 200 of a memory array that includes a plurality of integrated 1T1R RRAM memory cells consistent with several embodiments of the present disclosure. Memory array portion 200 includes a plurality of integrated memory cells, e.g., integrated memory cells 211, 212, 221, 222. Each integrated memory cell 211, 212, 221, 222 includes a respective BJT 215, 216, 225, 226 and integrated resistive element 213, 214, 223, 224, respectively. Integrated memory cells 211, 212, 221, 222 are examples of the integrated 1T1R memory cell structure 100, BJTs 215, 216, 225, 226 are examples of BJT 103 and integrated resistive elements 213, 214, 223, 224 are examples of integrated resistive element 101 of FIG. 1.

Base contacts of integrated memory cells 211, 212 are coupled to a first word line WL1 and base contacts of memory cells 221, 222 are coupled to a second word line WL2. Integrated emitter contacts of integrated memory cells 211, 221 are coupled to a first bit line BL1 and integrated emitter contacts of integrated memory cells 212, 222 are coupled to a second bit line BL2. Collector contacts of integrated memory cells 211, 221 are coupled to a first selector line SL1 and collector contacts of integrated memory cells 212, 222 are coupled to a second selector line SL2. For example, for integrated memory cell 211, a base contact 202 is coupled to WL1, a collector contact 206 is coupled to SL1 and an integrated emitter contact 204 is coupled to BL1. Thus, in operation, an integrated memory cell may be accessed for read and/or write operations by control of voltage and current applied to appropriate word line, bit line and selector line. For example, integrated memory cell 211 may be accessed via WL1, SL1, and BL1.

Figure 3:
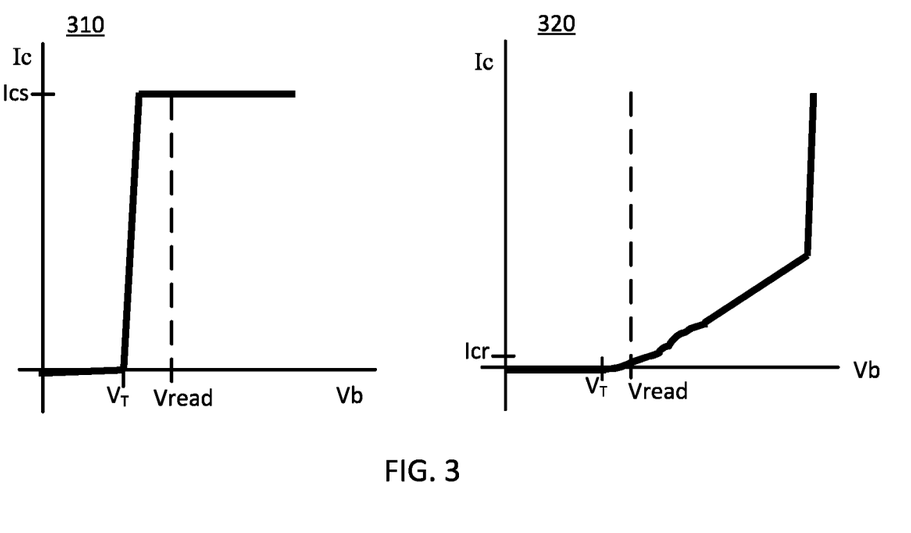
FIG. 3 illustrates plots of current versus voltage for read operations for an example integrated 1T1R memory cell consistent with one embodiment of the present disclosure.

FIG. 3 illustrates plots 310, 320 of current versus voltage for read operations for an example integrated 1T1R memory cell consistent with one embodiment of the present disclosure. In the plots 310, 320, the horizontal axis corresponds to base-emitter voltage, $V_b$, in volts (V) and the vertical axis corresponds to collector current, $I_C$, in amperes (A) for an integrated memory cell, e.g., integrated memory cell structure 100 of FIG. 1. Plot 310 illustrates collector current when the integrated memory cell is set, i.e., the resistive element is in the LRS. Plot 320 illustrates collector current when the integrated memory cell is reset, i.e., the resistive element is in the HRS. A read bias voltage, $V_{read}$, may be applied across the base-integrated emitter of the integrated memory cell, e.g., via WL1 and BL1, for integrated memory cell 211 of FIG. 2. For example, Vread may be at or near 0.6 V. The read bias voltage is configured to be greater than a threshold voltage of the BJT of integrated memory cell 211 but less than a programming voltage of the resistive element 213.

As illustrated by plot 310, the collector current is Ics (i.e., set state collector current) at $V_b=V_{read}$. In other words, the resistive element, e.g., resistive element 213 of FIG. 2, is in the LRS and the integrated memory cell is in the set state. As illustrated by plot 320, collector current is Icr (i.e., reset state collector current) at $V_b=V_{read}$. In other words, the resistive element, e.g., resistive element 213 of FIG. 2, is in the HRS and the integrated memory cell is in the reset state. Thus, during a read operation, the state of a selected integrated memory cell may be determined based, at least in part, on collector current (and/or emitter current) of the selected integrated memory cell, e.g., integrated memory cell 211 of FIG. 2.

Figure 4:
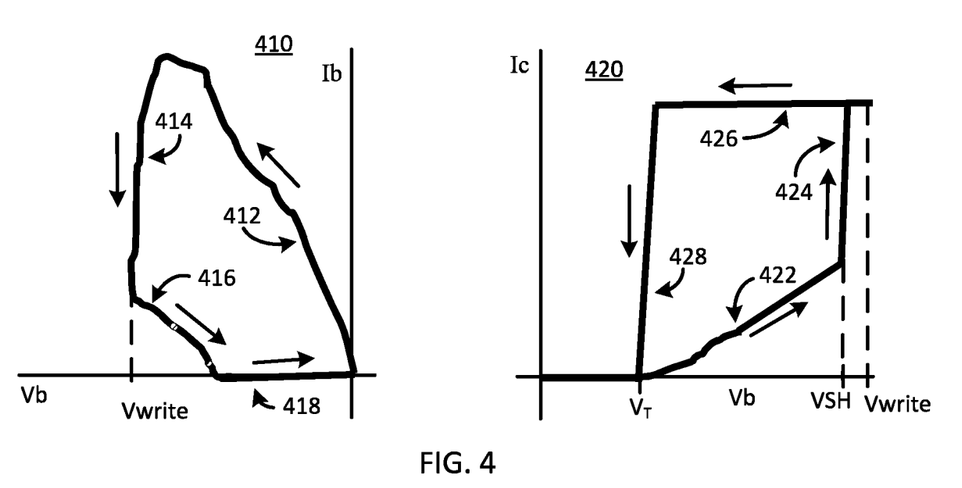
FIG. 4 illustrates plots of current versus voltage for write operations for an example integrated 1T1R memory cell consistent with one embodiment of the present disclosure.

FIG. 4 illustrates plots 410, 420 of current versus voltage for write operations for an example integrated 1T1R memory cell consistent with one embodiment of the present disclosure. Plot 410 illustrates a reset operation to transition a resistive element of a selected integrated memory cell from the LRS to the HRS. Plot 420 illustrates a set operation to transition a resistive element of a selected integrated memory cell from the HRS to the LRS. For both plots 410 and 420 the horizontal axis is base-integrated emitter bias voltage and the straight arrows indicate direction of traverse. Plot 410 illustrates base current versus bias voltage and the plot 420 illustrates collector current versus bias voltage of a selected integrated memory cell, e.g., integrated memory cell 211 of FIG. 2.

During a reset operation, a negative bias voltage, Vwrite, that is less than or equal to a negative programming voltage may be applied across the base-integrated emitter contacts of the selected integrated memory cell, e.g., contacts 202 and 204 of integrated memory cell 211 of FIG. 2. Initially, the bias voltage may be zero. As the bias voltage is decreased, e.g., portion 412 of plot 410, the base current may increase. When the bias voltage equals the negative programming voltage, the base current may decrease relatively rapidly, e.g., portion 414 of plot 410, as the resistance of the resistive element, e.g., integrated resistive element 213, transitions from the LRS to the HRS. After the resistive element changes state, the bias voltage may be increased, and the base current may decrease to zero, e.g., portion 416. The base current may remain zero as the bias voltage is increased to zero, e.g., portion 418. It may be appreciated, that the base current represents a flow of holes in the base-emitter junction of the integrated memory cell BJT, e.g., BJT 215 of FIG. 2.

During a set operation, a positive bias voltage, Vwrite, that is greater than or equal to a positive programming voltage may be applied across the base-integrated emitter contacts of the selected integrated memory cell, e.g., contacts 202 and 204 of integrated memory cell 211. Initially, the bias voltage may be zero. As the bias voltage is increased, the collector current may remain zero until the bias voltage reaches the threshold voltage, $V_T$, at which point the collector current may begin to increase. As the bias voltage is further increased, e.g., portion 422 of plot 420, the collector current may continue to increase. When the bias voltage equals the positive programming voltage, $V_{SH}$, the collector current may increase relatively rapidly, e.g., portion 424 of plot 420, as the resistance of the resistive element (e.g., integrated resistive element 213) transitions from the HRS to the LRS. The bias voltage, Vwrite, is configured to be greater than the positive programming voltage, $V_{SH}$. After the resistive element changes state, the bias voltage may be decreased. Initially, the collector current may remain constant, e.g., portion 426. For example, the collector current may be current limited, as described herein. When the bias voltage reaches the threshold voltage, the BJT may turn off and the collector current may drop to zero, e.g., portion 428.

Thus, an integrated memory cell, e.g., integrated memory cell 100, that includes an integrated resistive element, e.g., resistive element 101, may be selected, read from and/or written to (i.e., set or reset) by controlling at least the base voltage of the BJT, e.g., BJT 103. The memory access operations may be performed by applying voltage and/or current pulses, with a pulse duration in the range of 10 nanoseconds (ns) to 100 ns, to the integrated memory cells.

Turning again to FIG. 2, a selected integrated memory cell, e.g., integrated memory cell 211, may be read from and/or written to by applying appropriate voltages to first word line WL1, first bit line BL1 and/or first selector line SL1. Voltages may also be applied to, for example, second bit line BL2, second and third word lines WL2, WL3, and/or second selector line SL2 configured to avoid unintentionally selecting integrated memory cells that are adjacent the selected memory cell 211, e.g., integrated memory cells 212, 221 and/or 222. The voltages applied to, e.g., second bit line BL2, second and third word lines WL2, WL3, and/or second selector line SL2 may be configured to reduce and/or minimize leakage current from adjacent integrated memory cells, e.g., integrated memory cells 212, 221, 222, that are adjacent selected integrated memory cell 211. Table 1 illustrates one example of applied voltages associated with reading from and writing to selected integrated memory cell 211.

TABLE 1

| | Line | | | | | | |
|---|---|---|---|---|---|---|---|
| Operation | WL1 (V) | WL2 (V) | WL3 (V) | BL1 (V) | BL2 (V) | SL1 (V) | SL2 (V) |
| Read | 0 | −0.3 | −0.3 | −0.6 | −0.3 | 0 | 0 |
| Write (set) | 0 | −0.45 | −0.45 | −0.9 | −0.45 | 0 | 0 |
| Write (reset) | 0 | −0.45 | −0.45 | 0.9 | 0 | 0.45 | 0.45 |

For example, for a read operation, the base-integrated emitter voltage of integrated memory cell 211 is 0.6 V, the base-integrated emitter voltage of integrated memory cells 212 and 221 is 0.3 V and the base-integrated emitter voltage of integrated memory cell 222 is 0 V. For example, for integrated memory cell 211, the base-integrated emitter voltage corresponds to the WL1 voltage minus the BL1 voltage. Thus, the base-integrated emitter voltage is also across the resistive element 213. The collector-base voltage of the selected integrated memory cell 211 and integrated memory cell 212 is 0 V. The collector-base voltage corresponds to the SL1 voltage minus the WL1 voltage for integrated memory cell 211. The collector-base voltage of integrated memory cells 221 and 222 is 0.3 V. In this example, 0.6 V corresponds to the Vread of FIG. 3. Thus, the base-emitter junction of only the selected integrated memory cells, e.g., integrated memory cell 211, is forward biased and the collector current may be utilized to determine the state of the integrated resistive element 213.

In another example, for a write operation configured to set the selected integrated memory cell 211, i.e., transition the integrated resistive element 213 of the selected integrated memory cell 211 from an HRS to an LRS, the base-integrated emitter voltage of integrated memory cell 211 is 0.9 V. Continuing with this example, the base-integrated emitter voltage of integrated memory cell 212 is 0.45 V and the base-integrated emitter voltage of integrated memory cells 221, 222 is 0 V. The collector-base voltage of selected integrated memory cell 211 and integrated memory cell 212 is 0 V. The collector-base voltage of integrated memory cells 221, 222 is 0.45 V. In this example, 0.9 V corresponds to Vwrite of FIG. 4.

In another example, for a write operation configured to reset the selected integrated memory cell 211, i.e., transition the integrated resistive element 213 of the selected integrated memory cell 211 from an LRS to an HRS, the base-integrated emitter voltage of integrated memory cell 211 is −0.9 V. Continuing with this example, the base-integrated emitter voltages of integrated memory cell 212, 221, 222 are 0 V, −0.45 V and 0.45 V, respectively. The collector-base voltage of selected integrated memory cell 211 is 0.45 V. The collector-base voltages of integrated memory cells 212, 221 and 222 are 0.45 V, 0 V and 0 V, respectively. In this example −0.9 V corresponds to Vwrite of FIG. 4.

Thus, an integrated memory cell, e.g., integrated memory cell 211, may be selected for read and/or write operations. Adjacent integrated memory cells, e.g., integrated memory cells 212, 221 and/or 222, may be biased to reduce the likelihood of inadvertently selecting the adjacent integrated memory cells and/or to reduce and/or minimize leakage current (e.g., collector current). Utilizing a BJT, e.g., BJT 215, as the selector transistor in the integrated memory cell facilitates providing an emitter current to the resistive element that is greater than the base current provided to the integrated memory cell. In other words, the current gain associated with the BJT may facilitate memory access operations. Leakage current may be further mitigated by including a second transistor, e.g., a MOSFET ("MOS transistor"), between the integrated emitter contact and the associated bit line.

Figure 5:
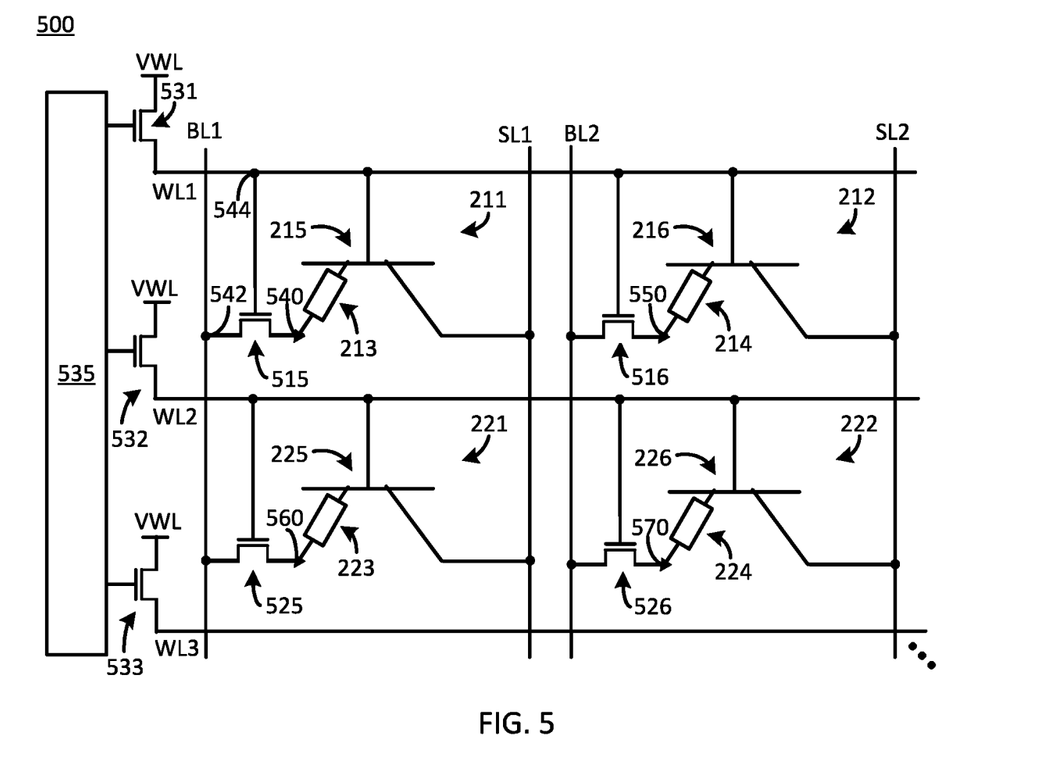
FIG. 5 illustrates another circuit diagram of portion of a memory array that includes a plurality of integrated 1T1R RRAM memory cells consistent with several embodiments of the present disclosure.

FIG. 5 illustrates a circuit diagram of another portion 500 of a memory array that includes a plurality of integrated 1T1R RRAM memory cells consistent with several embodiments of the present disclosure. In FIG. 5 and FIG. 2, like reference designators correspond to like elements. Memory array portion 500 includes integrated memory cells 211, 212, 221, 222. Each integrated memory cell 211, 212, 221 and 222 includes a respective BJT 215, 216, 225 and 226 and a respective integrated resistive element 213, 214, 223 and 224. Memory array portion 500 further includes MOS transistors 515, 516, 525 and 526. Memory array portion 500 may include MOS transistors 531, 532, 533 and controller 535.

The MOS transistors 515, 516, 525 and 526 are configured to reduce and/or minimize leakage current from associated integrated memory cells 211, 212, 221, 222, when the associated integrated memory cell is not selected, i.e., is unselected. For example, a source electrode of MOS transistor 515 is coupled to the integrated emitter contact 540 of integrated memory cell 211, i.e., the source electrode of MOS transistor 515 is coupled to resistive element 213. A drain electrode 542) of MOS transistor 515 is coupled to the first bit line BL1. A gate electrode 544 of MOS transistor 515 is coupled to the first word line WL1. MOS transistor 516 is coupled between the integrated emitter contact 550 of integrated memory cell 212 and the second bit line BL2 and the gate of MOS transistor 516 is coupled to the first word line WL1. MOS transistor 525 is coupled between the integrated emitter contact 560 of integrated memory cell 221 and the first bit line BL1 and the gate of MOS transistor 525 is coupled to the second word line WL2. MOS transistor 526 is coupled between the integrated emitter contact 570 of integrated memory cell 222 and the second bit line BL2 and the gate of MOS transistor 526 is coupled to the second word line WL2.

In operation, selecting an integrated memory cell, e.g., integrated memory cell 211, for memory access operations may also select the corresponding MOS transistor, e.g., MOS transistor 515. In other words, the selected MOS transistor may be turned on when the associated integrated memory cell is selected. For example, controller 535 may be configured to select integrated memory cell 211 by coupling the first word line WL1, first bit line BL1 and/or first selector line SL1 to a corresponding supply voltage and/or sensing circuitry (not shown). The MOS transistors associated with the unselected integrated memory cells, e.g., integrated memory cells 212, 221, 222, may remain turned off, thus, decoupling the unselected integrated memory cell from the respective bit line and corresponding bit line voltage. Thus, leakage current from unselected integrated memory cells may be reduced and/or eliminated.

In some embodiments, memory array portion 500 may include MOS transistors 531, 532, 533. MOS transistors 531, 532, 533 may be configured to limit current drawn from respective word lines WL1, WL2, WL3. For example, MOS transistors 531, 532, 533 may be positioned between a word line voltage source, VWL and each word line, e.g., word lines WL1, WL2, WL3. Respective gate electrodes of MOS transistors 531, 532, 533 may be coupled to controller 535. Controller 535 may be configured to control gate-source bias voltage of the MOS transistors 531, 532, 533 to limit the current provided to word lines WL1, WL2, WL3 during, for example, memory access operations. Thus, MOS transistors 531, 532, 533 may be configured to limit write currents and/or read currents, e.g., when the selected integrated memory cell is in or is transitioning to the LRS.

Thus, an integrated memory cell may be selected for memory access operations. Read operations may be configured to detect and/or determine a resistance of the integrated resistive element. Write operations may be configured to transition the resistive element from the HRS to the LRS or from the LRS to the HRS. The associated integrated BJTs may be configured to provide current amplification to support the memory access operations. In some embodiments, MOS transistors may be coupled to each integrated memory cell in order to reduce and/or eliminate leakage current for unselected integrated memory cells. In some embodiments, MOS transistors may be positioned between a word line supply voltage and respective word lines configured to limit current supplied to selected integrated memory cells.

Figure 6:
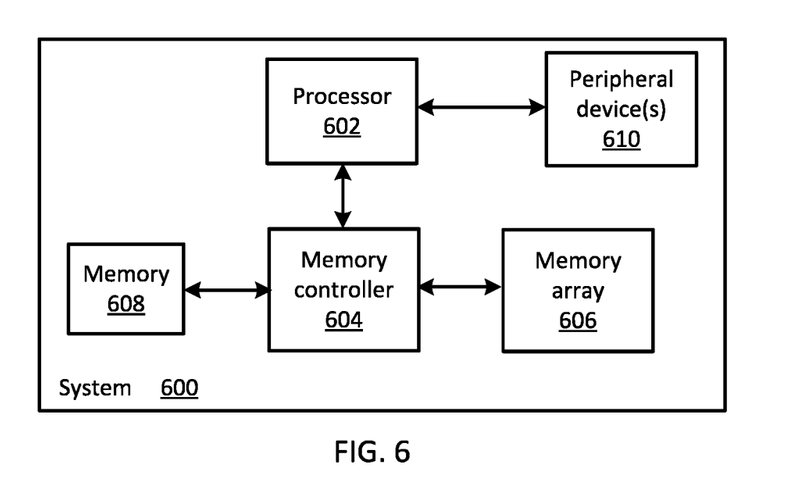
FIG. 6 illustrates a functional block diagram of a system including a memory array consistent with several embodiments of the present disclosure.

FIG. 6 illustrates a functional block diagram of a system 600 including a memory array consistent with several embodiments of the present disclosure. System 600 includes a processor 602, a memory controller 604 and a memory array 606. The system 600 may further include memory 608 and/or one or more peripheral devices 610. System 600 may include, but is not limited to, a mobile telephone including, but not limited to a smart phone (e.g., iPhone®, Android®-based phone, Blackberry®, Symbian®-based phone, Palm®-based phone, etc.); a wearable device (e.g., wearable computer, "smart" watches, smart glasses, smart clothing, etc.) and/or system; an Internet of Things (IoT) networked device including, but not limited to, a sensor system (e.g., environmental, position, motion, etc.) and/or a sensor network (wired and/or wireless); a computing system (e.g., a server, a workstation computer, a desktop computer, a laptop computer, a tablet computer (e.g., iPad®, GalaxyTab® and the like), an ultraportable computer, an ultramobile computer, a netbook computer and/or a subnotebook computer; etc.

Processor 602 is configured to perform operations associated with system 600. Processor 602 may include one or more processing unit(s), i.e., cores. Memory controller 604 is configured to couple processor 602 to memory array 606 and/or memory 608. For example, controller 535 of FIG. 5 may correspond to and/or be included in memory controller 604. Peripheral devices 610 may include a user interface (e.g., a key pad, keyboard, touch pad, mouse, display, touch sensitive display), one or more sensor(s) (e.g., an accelerometer, global positioning system (GPS), gyroscope, etc.), storage device(s) (e.g., hard disk drive, solid state drive, etc.), etc.

Memory array 606 may contain a plurality of integrated 1T1R memory cells, as described herein. For example, memory array portion 200 of FIG. 2 may correspond to a portion of memory array 606. In another example, memory array portion 500 of FIG. 5 may correspond to a portion of memory array 606. Memory controller 604 may be configured to provide control inputs to integrated memory cells included in memory array 606 and to capture output signals. For example, memory controller 604 may be configured to select and/or unselect one or more integrated memory cells and to set, reset and/or read selected integrated memory cells.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

Thus, this disclosure relates to an integrated 1T1R RRAM memory cell. Each memory cell includes a bipolar junction transistor (BJT) and an integrated resistive element. The resistive element includes a resistive layer and an electrode. The resistive element is positioned between a base region and an integrated emitter contact of the BJT.

Integrating the resistive element and the transistor, consistent with the present disclosure, may facilitate fabricating 1T1R memory cells. In other words, rather than fabricating the transistor and the resistive element as separate devices on separate, interconnected layers of a device, the resistive element and transistor are integrated. A BJT may provide relatively higher current than a corresponding MOSFET thus, facilitating relatively more reliable programming of the memory cell.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

The foregoing provides example system architectures and methodologies, however, modifications to the present disclosure are possible. The processor 602 may include one or more processor cores and may be configured to execute system software. System software may include, for example, an operating system. Device memory may include I/O memory buffers configured to store one or more data packets that are to be transmitted by, or received by, a network interface.

Memory 608 may include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800™-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a method, means for performing acts of the method, a device, or of an apparatus or system related to an integrated 1T1R RRAM memory cell, as discussed below.

Example 1

According to this example, there is provided an apparatus. The apparatus includes a bipolar junction transistor (BJT) and an integrated resistive element. The bipolar junction transistor (BJT) includes a base contact, a base region, a collector contact, a collector region and an integrated emitter contact. The integrated resistive element includes a resistive layer and an integrated electrode. The resistive element is positioned between the base region and the integrated emitter contact.

Example 2

This example includes the elements of example 1, wherein the resistive layer includes a plurality of sub-layers.

Example 3

This example includes the elements of example 1, wherein the resistive layer includes an oxide material or a chalcogenide material.

Example 4

This example includes the elements of example 1, wherein the integrated electrode is formed of a conductive or a semi-conductive material.

Example 5

This example includes the elements according to any one of examples 1 through 4, wherein the integrated electrode includes one or more of Ta (tantalum), Hf (hafnium), Ti (titanium), TiN (titanium nitride), TaN (tantalum nitride), TiAlN (titanium aluminum nitride), TaAlN (tantalum aluminum nitride) and/or alloys and/or combinations thereof.

Example 6

This example includes the elements according to any one of examples 1 through 4, wherein the integrated electrode includes an oxide material.

Example 7

This example includes the elements according to any one of examples 1 through 4, wherein the resistive layer includes an oxide material selected from the group including one or more of HfOx (hafnium oxide), TaOx (tantalum oxide), WOx (tungsten oxide), TiOx (titanium oxide), SiOx (silicon oxide), AlOx (aluminum oxide) and/or alloys and/or combinations thereof.

Example 8

This example includes the elements according to any one of examples 1 through 4, wherein the resistive layer includes a chalcogenide material selected from the group including S (sulfur), Se (selenium), Te (tellurium), GeTe (germanium tellurium) and SiTe (silicon tellurium) and/or alloys and/or combinations thereof.

Example 9

This example includes the elements according to any one of examples 1 through 4, wherein at least one of the base region and/or collector region includes one or more of group III-V elements.

Example 10

This example includes the elements according to any one of examples 1 through 4, wherein at least one of the base region and/or the collector region includes a group IV element.

Example 11

This example includes the elements according to any one of examples 1 through 4, wherein the integrated electrode is to interact with the resistive layer in response to a first applied bias voltage to create a conductive path between the integrated electrode and the base region or in response to a second applied bias voltage to break the conductive path between the integrated electrode and the base region.

Example 12

This example includes the elements according to any one of examples 1 through 4, wherein a width $W_E$ of the integrated electrode is in the range of 2 nanometers (nm) to 10 nm, a width $W_R$ of the resistive layer is in the range of 2 nm to 10 nm, a width $W_C$ of the collector region is less than 10 nm and a width $W_B$ of the base region is in the range of 1 nm to 25 nm and is less than a carrier diffusion length.

Example 13

According to this example, there is provided a system. The system includes a processor, a memory controller, and a memory array. The memory array includes a plurality of memory cells. Each memory cell includes a bipolar junction transistor (BJT) and an integrated resistive element. The bipolar junction transistor (BJT) includes a base contact, a base region, a collector contact, a collector region and an integrated emitter contact. The integrated resistive element includes a resistive layer and an integrated electrode. The resistive element is positioned between the base region and the integrated emitter contact.

Example 14

This example includes the elements of example 13, wherein the resistive layer includes a plurality of sub-layers.

Example 15

This example includes the elements of example 13, wherein the resistive layer includes an oxide material or a chalcogenide material.

Example 16

This example includes the elements of example 13, wherein the integrated electrode is formed of a conductive or a semi-conductive material.

Example 17

The example includes the elements according to any one of examples 13 through 16, wherein the integrated electrode includes one or more of Ta (tantalum), Hf (hafnium), Ti (titanium), TiN (titanium nitride), TaN (tantalum nitride), TiAlN (titanium aluminum nitride), TaAlN (tantalum aluminum nitride) and/or alloys and/or combinations thereof.

Example 18

The example includes the elements according to any one of examples 13 through 16, wherein the integrated electrode includes an oxide material.

Example 19

The example includes the elements according to any one of examples 13 through 16, wherein the resistive layer includes an oxide material selected from the group including one or more of HfOx (hafnium oxide), TaOx (tantalum oxide), WOx (tungsten oxide), TiOx (titanium oxide), SiOx (silicon oxide), AlOx (aluminum oxide) and/or alloys and/or combinations thereof.

Example 20

The example includes the elements according to any one of examples 13 through 16, wherein the resistive layer includes a chalcogenide material selected from the group including S (sulfur), Se (selenium), Te (tellurium), GeTe (germanium tellurium) and SiTe (silicon tellurium) and/or alloys and/or combinations thereof.

Example 21

The example includes the elements according to any one of examples 13 through 16, wherein at least one of the base region and/or collector region includes one or more of group III-V elements.

Example 22

The example includes the elements according to any one of examples 13 through 16, wherein at least one of the base region and/or the collector region includes a group IV element.

Example 23

The example includes the elements according to any one of examples 13 through 16, wherein the integrated electrode is to interact with the resistive layer in response to a first applied bias voltage to create a conductive path between the integrated electrode and the base region or in response to a second applied bias voltage to break the conductive path between the integrated electrode and the base region.

Example 24

The example includes the elements according to any one of examples 13 through 16, wherein a width $W_E$ of the integrated electrode is in the range of 2 nanometers (nm) to 10 nm, a width $W_R$ of the resistive layer is in the range of 2 nm to 10 nm, a width $W_C$ of the collector region is less than 10 nm and a width $W_B$ of the base region is in the range of 1 nm to 25 nm and is less than a carrier diffusion length.

Example 25

The example includes the elements according to any one of examples 13 through 16, wherein each memory cell further includes a metal oxide semiconductor field effect transistor ("MOS transistor") coupled to the integrated emitter contact, the MOS transistor to reduce a leakage current when an associated memory cell is not selected.

Example 26

The example includes the elements according to any one of examples 13 through 16, wherein the memory array further includes a current limiting transistor coupled to the word line, a subset of the plurality of memory cells coupled to the word line.

Example 27

According to this example, there is provided a memory array. The memory array includes a word line, a bit line, a selector line, and a plurality of memory cells. Each memory cell includes a bipolar junction transistor (BJT) and an integrated resistive element. The bipolar junction transistor (BJT) includes a base contact, a base region, a collector contact, a collector region, and an integrated emitter contact. The integrated resistive element includes a resistive layer and an integrated electrode. The resistive element is positioned between the base region and the integrated emitter contact.

Example 28

This example includes the elements of example 27, wherein the resistive layer includes a plurality of sub-layers.

Example 29

This example includes the elements of example 27, wherein the resistive layer includes an oxide material or a chalcogenide material.

Example 30

This example includes the elements of example 27, wherein the integrated electrode is formed of a conductive or a semi-conductive material.

Example 31

The example includes the elements according to any one of examples 27 through 30, wherein the integrated electrode includes one or more of Ta (tantalum), Hf (hafnium), Ti (titanium), TiN (titanium nitride), TaN (tantalum nitride), TiAlN (titanium aluminum nitride), TaAlN (tantalum aluminum nitride) and/or alloys and/or combinations thereof.

Example 32

The example includes the elements according to any one of examples 27 through 30, wherein the integrated electrode includes an oxide material.

Example 33

The example includes the elements according to any one of examples 27 through 30, wherein the resistive layer includes an oxide material selected from the group including one or more of HfOx (hafnium oxide), TaOx (tantalum oxide), WOx (tungsten oxide), TiOx (titanium oxide), SiOx (silicon oxide), AlOx (aluminum oxide) and/or alloys and/or combinations thereof.

Example 34

The example includes the elements according to any one of examples 27 through 30, wherein the resistive layer includes a chalcogenide material selected from the group including S (sulfur), Se (selenium), Te (tellurium), GeTe (germanium tellurium) and SiTe (silicon tellurium) and/or alloys and/or combinations thereof.

Example 35

The example includes the elements according to any one of examples 27 through 30, wherein at least one of the base region and/or collector region includes one or more of group III-V elements.

Example 36

The example includes the elements according to any one of examples 27 through 30, wherein at least one of the base region and/or the collector region includes a group IV element.

Example 37

The example includes the elements according to any one of examples 27 through 30, wherein the integrated electrode is to interact with the resistive layer in response to a first applied bias voltage to create a conductive path between the integrated electrode and the base region or in response to a second applied bias voltage to break the conductive path between the integrated electrode and the base region.

Example 38

The example includes the elements according to any one of examples 27 through 30, wherein a width $W_E$ of the integrated electrode is in the range of 2 nanometers (nm) to 10 nm, a width $W_R$ of the resistive layer is in the range of 2 nm to 10 nm, a width $W_C$ of the collector region is less than 10 nm and a width $W_B$ of the base region is in the range of 1 nm to 25 nm and is less than a carrier diffusion length.

Example 39

The example includes the elements according to any one of examples 27 through 30, wherein each memory cell further includes a metal oxide semiconductor field effect transistor ("MOS transistor") coupled to the integrated emitter contact, the MOS transistor to reduce a leakage current when an associated memory cell is not selected.

Example 40

The example includes the elements according to any one of examples 27 through 30, wherein the memory array further includes a current limiting transistor coupled to the word line, a subset of the plurality of memory cells coupled to the word line.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
   a bipolar junction transistor (BJT) comprising a base contact, a base region, a collector contact, a collector region and an integrated emitter contact; and
   an integrated resistive element comprising a resistive layer disposed proximate an integrated electrode layer, the integrated resistive element positioned between the base region and the integrated emitter contact such that at least a portion of the resistive layer is disposed proximate the base region and at least a portion of the integrated electrode layer is disposed proximate the integrated emitter contact.

2. The apparatus of claim 1, wherein the resistive layer comprises a plurality of sub-layers.

3. The apparatus of claim 1, wherein the resistive layer comprises an oxide material or a chalcogenide material.

4. The apparatus of claim 1, wherein the integrated electrode is formed of a conductive or a semi-conductive material.

5. The apparatus of claim 1, wherein the resistive layer comprises an oxide material selected from the group comprising one or more of HfOx (hafnium oxide), TaOx (tantalum oxide), WOx (tungsten oxide), TiOx (titanium oxide), SiOx (silicon oxide), AlOx (aluminum oxide) and/or alloys and/or combinations thereof, or the resistive layer comprises a chalcogenide material selected from the group comprising S (sulfur), Se (selenium), Te (tellurium), GeTe (germanium tellurium) and SiTe (silicon tellurium) and/or alloys and/or combinations thereof.

6. The apparatus of claim 1, wherein at least one of the base region and/or collector region comprises one or more of group III-V elements.

7. The apparatus of claim 1, wherein at least one of the base region and/or the collector region comprises a group IV element.

8. The apparatus of claim 1, wherein the integrated electrode is to interact with the resistive layer in response to a first applied bias voltage to create a conductive path between the integrated electrode and the base region or in response to a second applied bias voltage to break the conductive path between the integrated electrode and the base region.

9. The apparatus of claim 1, wherein a width $W_E$ of the integrated electrode is in the range of 2 nanometers (nm) to 10 nm, a width $W_R$ of the resistive layer is in the range of 2 nm to 10 nm, a width $W_C$ of the collector region is less than 10 nm and a width $W_B$ of the base region is in the range of 1 nm to 25 nm and is less than a carrier diffusion length.

10. A system comprising:
    a processor;
    a memory controller; and
    a memory array, the memory array comprising a plurality of memory cells, each memory cell comprising:
      a bipolar junction transistor (BJT) comprising a base contact, a base region, a collector contact, a collector region and an integrated emitter contact; and
      an integrated resistive element comprising a resistive layer and an integrated electrode, the resistive element positioned between the base region and the integrated emitter contact.

11. The system of claim 10, wherein the resistive layer comprises a plurality of sub-layers.

12. The system of claim 10, wherein the resistive layer comprises an oxide material or a chalcogenide material.

13. The system of claim 10, wherein the integrated electrode is formed of a conductive or a semi-conductive material.

14. The system of claim 10, wherein the resistive layer comprises an oxide material selected from the group comprising one or more of HfOx (hafnium oxide), TaOx (tantalum oxide), WOx (tungsten oxide), TiOx (titanium oxide), SiOx (silicon oxide), AlOx (aluminum oxide) and/or alloys and/or combinations thereof, or the resistive layer comprises a chalcogenide material selected from the group comprising S (sulfur), Se (selenium), Te (tellurium), GeTe (germanium tellurium) and SiTe (silicon tellurium) and/or alloys and/or combinations thereof.

15. The system of claim 10, wherein the integrated electrode is to interact with the resistive layer in response to a first applied bias voltage to create a conductive path between the integrated electrode and the base region or in response to a second applied bias voltage to break the conductive path between the integrated electrode and the base region.

16. The system of claim 10, wherein each memory cell further comprises a metal oxide semiconductor field effect transistor ("MOS transistor") coupled to the integrated emitter contact, the MOS transistor to reduce a leakage current when an associated memory cell is not selected.

17. The system of claim 10, wherein the memory array further comprises a current limiting transistor coupled to the word line, a subset of the plurality of memory cells coupled to the word line.

18. A memory array comprising:
a word line, a bit line and a selector line; and
a plurality of memory cells, each memory cell comprising:
   a bipolar junction transistor (BJT) comprising a base contact, a base region, a collector contact, a collector region and an integrated emitter contact; and
   an integrated resistive element comprising a resistive layer and an integrated electrode, the resistive element positioned between the base region and the integrated emitter contact.

19. The memory array of claim 18, wherein the resistive layer comprises a plurality of sub-layers.

20. The memory array of claim 18, wherein the resistive layer comprises an oxide material or a chalcogenide material.

21. The memory array of claim 18, wherein the integrated electrode is formed of a conductive or a semi-conductive material.

22. The memory array of claim 18, wherein the resistive layer comprises an oxide material selected from the group comprising one or more of HfOx (hafnium oxide), TaOx (tantalum oxide), WOx (tungsten oxide), TiOx (titanium oxide), SiOx (silicon oxide), AlOx (aluminum oxide) and/or alloys and/or combinations thereof, or the resistive layer comprises a chalcogenide material selected from the group comprising S (sulfur), Se (selenium), Te (tellurium), GeTe (germanium tellurium) and SiTe (silicon tellurium) and/or alloys and/or combinations thereof.

23. The memory array of claim 18, wherein the integrated electrode is to interact with the resistive layer in response to a first applied bias voltage to create a conductive path between the integrated electrode and the base region or in response to a second applied bias voltage to break the conductive path between the integrated electrode and the base region.

24. The memory array of claim 18, wherein each memory cell further comprises a metal oxide semiconductor field effect transistor ("MOS transistor") coupled to the integrated emitter contact, the MOS transistor to reduce a leakage current when an associated memory cell is not selected.

25. The memory array of claim 18, wherein the memory array further comprises a current limiting transistor coupled to the word line, a subset of the plurality of memory cells coupled to the word line.

* * * * *